(12) United States Patent
Baskett

(10) Patent No.: US 6,333,672 B1
(45) Date of Patent: Dec. 25, 2001

(54) DIFFERENTIAL LOGIC CIRCUIT AND METHOD OF USE

(75) Inventor: Ira Emmet Baskett, Tempe, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/676,659

(22) Filed: Oct. 2, 2000

(51) Int. Cl.[7] ...................................................... G06G 7/12
(52) U.S. Cl. ............................................. 327/563; 327/65
(58) Field of Search .................................. 327/52, 53, 63, 327/65, 66, 68, 77, 89, 560–563; 326/126, 127; 330/252, 254, 281

(56) References Cited

U.S. PATENT DOCUMENTS

| | | | |
|---|---|---|---|
| 5,389,893 | * | 2/1995 | Itri et al. ................................ 330/254 |
| 5,525,924 | * | 6/1996 | Ueno et al. ............................ 327/563 |
| 5,587,674 | * | 12/1996 | Danstrom ................................ 327/65 |
| 5,606,272 | * | 2/1997 | Behbahani et al. ..................... 327/65 |

* cited by examiner

*Primary Examiner*—Toan Tran

(57) ABSTRACT

A differential logic gate (36) is provided with three current sources (56, 58 and 60). Current source (56) provides keep alive current flowing through transistor (48) when a logic low is presented at the base terminal of transistor 48. Current source (60) provides keep alive current flowing through transistor (50) when a logic low is presented at the base terminal of transistor 50. Current source (58) provides additional current drive when either transistor (48) or transistor (50) is conducting maximum current. Keep alive current sources (56 and 60) allow operation of differential logic gate (36) at reduced peak to peak voltage transitions with reduced ringing and smoother logic transitions.

20 Claims, 3 Drawing Sheets

DIFFERENTIAL LOGIC CIRCUIT AND METHOD OF USE

FIELD OF THE INVENTION

The present invention relates, in general, to differential logic gates and, more particularly, to differential logic gates, which utilize current sources to maintain the differential input transistor pair in their active regions.

BACKGROUND OF THE INVENTION

Differential logic gates have a wide range of applications. Clock generation circuits, for example, provide an excellent application for which differential logic gates can be used. Clock generation circuits implemented with differential logic gates have the capability of significantly reducing the clock skew and jitter over an equivalent design implemented with single-ended logic families. In fact, any application, which requires superior noise immunity, is especially suited for differential logic implementations. Differential inputs used in differential logic families promote common mode rejection of cross talk noise and EMI radiation.

Differential logic gates, however, can exhibit undesirable characteristics as well. Propagation delay exhibited by some prior art differential logic families is one such unattractive characteristic. Most of the propagation delay of differential logic gates can be attributed to the switching delay of each transistor in the differential pair. Each transistor of the differential pair is either in a conductive state or in a non-conductive state, depending upon the level of the logic applied to their respective control terminals. Time required to transition the transistor from a conductive state to a non-conductive state or vice versa is known as the switching delay. As the transistors transition between conduction states, the gain of the transistors also change, which causes ringing on the collector output voltages when the transistors are exhibiting high gain. As the gain changes on prior art differential logic gates, the input impedance also changes which creates difficulty when using controlled impedance transmission paths.

Referring to FIG. 1, an improved prior art differential logic circuit 10 is illustrated which provides one method of reducing switching delays induced by toggling the conduction states of differential input transistor pairs by using cascode amplifiers. Transistors 12 and 14 provide a cascode amplifier arrangement such that the voltage variation at nodes 26 and 28 is reduced. Reducing voltage variation at nodes 26 and 28 reduces the miller capacitance effect seen at terminals D and D-compliment, which reduces switching delays through prior art differential logic circuit 10. Voltage variation at nodes 26 and 28 can be further reduced by the addition of keep alive current sources 16 and 18. Keep alive current sources 16 and 18 provide a nominal amount of current flowing through cascode amplifiers 12 and 14 regardless of the conduction state of transistors 20 and 22, respectively. Sizing the keep alive current sources 16 and 18 such that current conduction through transistors 16 and 18 is a substantial portion of the total current entering nodes 26 and 28, respectively, the corresponding voltage variation at nodes 26 and 28 can be significantly reduced, thus substantially eliminating the miller effect. As logic families develop, however, the required input logic voltage swings diminish which inherently diminishes the magnitude of the miller effect. Additionally, as logic families develop, the top supply rail potential diminishes which requires reducing the number of base-emitter voltage ($V_{be}$) drops between top and bottom supply rail potentials. New logic families, therefore, no longer have the top supply rail potential headroom to support a cascode amplifier configuration to reduce the miller effect.

A need exists, therefore, for a differential logic gate, which provides reduced switching delay, reduced ringing and improved input impedance control without the need for an additional cascode amplifier configuration.

DETAILED DESCRIPTION OF THE DRAWINGS

Figure 1:
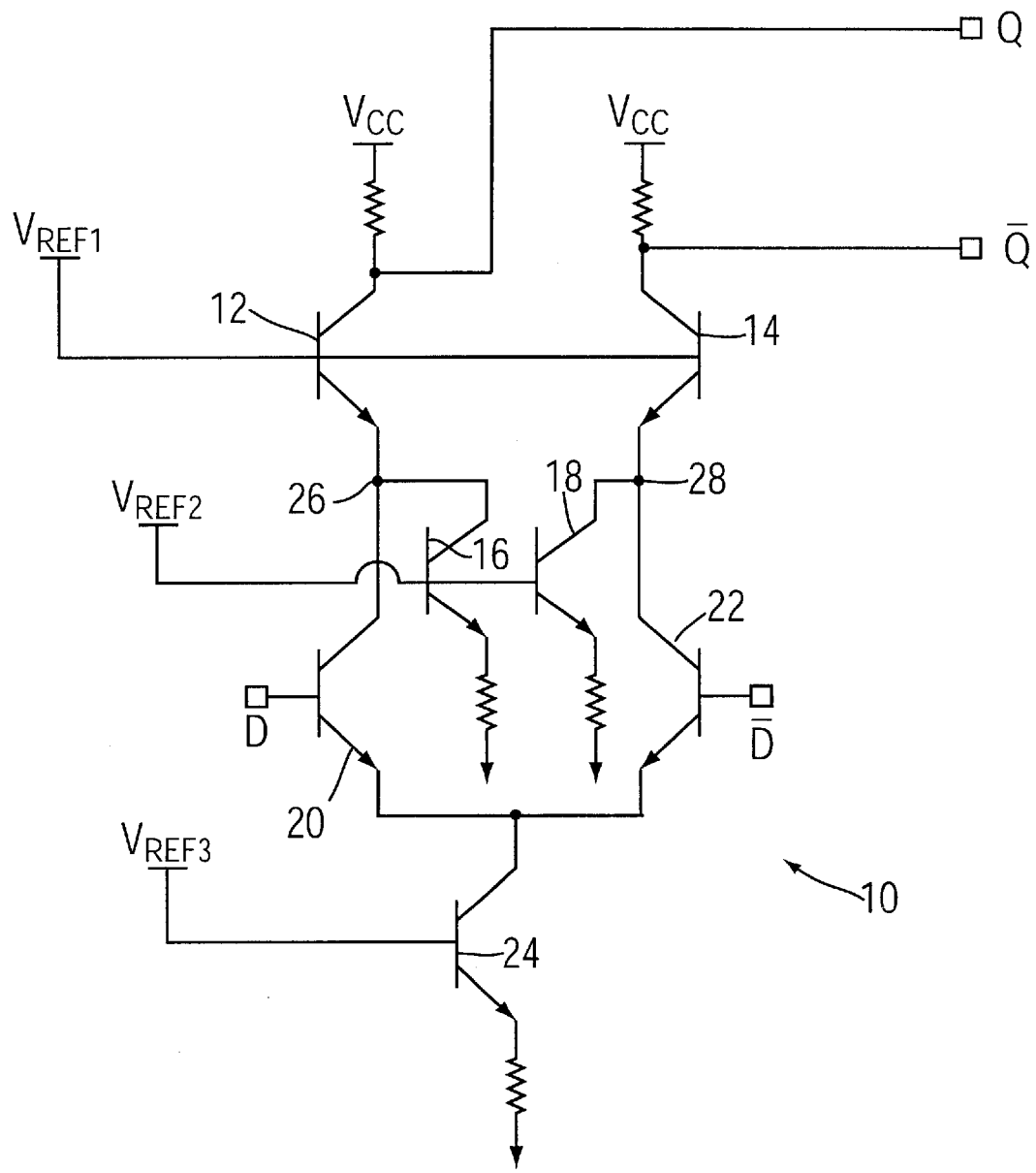
FIG. 1 is a schematic diagram of a prior art differential logic circuit.
Figure 2:
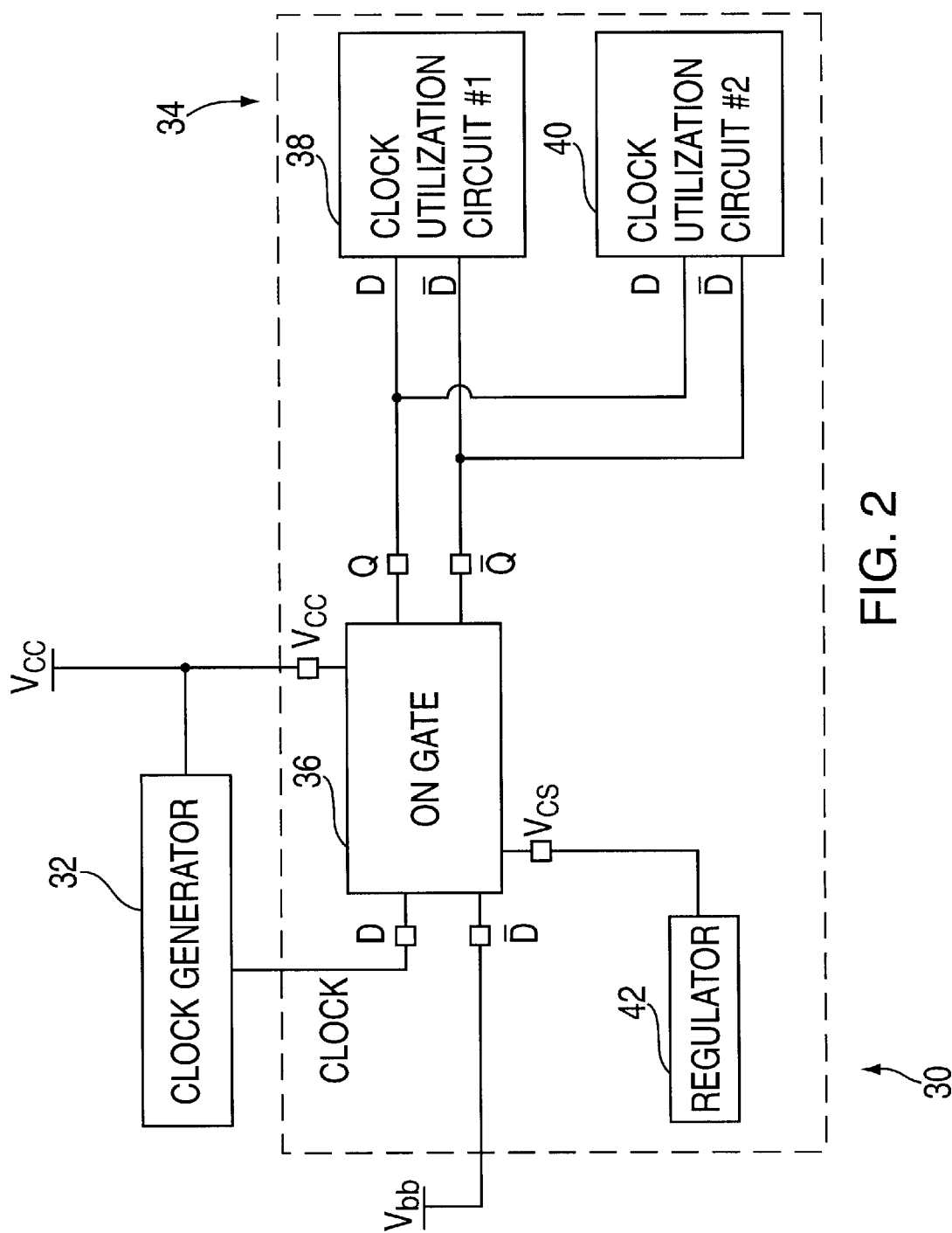
FIG. 2 is a block diagram of a clock distribution network implemented with an ON gate.

Referring to FIG. 2, a block diagram of a clock distribution network 30 is shown. Integrated circuit 34 contains a differential logic gate (ON gate) 36, a regulator 42 and a pair of typical utilization circuits 38 and 40. The utilization circuits are illustrated to be clock utilization circuits. The ON gate receives a regulated potential VCs from regulator 42 at terminal $V_{CS}$. A single ended clock signal is received from external clock generator 32 at terminal D. Terminal D-compliment receives a reference voltage $V_{bb}$, which is set to a DC level equal to the average voltage level of the clock signal provided at terminal D. ON gate 36 provides a differential clock signal, which exhibits reduced propagation delay and reduced output ringing, to clock utilization circuits 38 and 40. Clock utilization circuits 38 and 40 receive a differential clock signal at terminals D and D-compliment, respectively. A two clock signal fan out is shown in FIG. 2, however, ON gate 36 is capable of providing clock signal fan-outs on the order of 10–20. FIG. 2 illustrates a single application for ON gate 36 and is not intended to limit the scope of applications available for ON gate 36. In general, ON gate 36 may exist on an integrated circuit with a multitude of utilization circuits, which require logic levels exhibiting reduced propagation delay and reduced output ringing.

Figure 3:
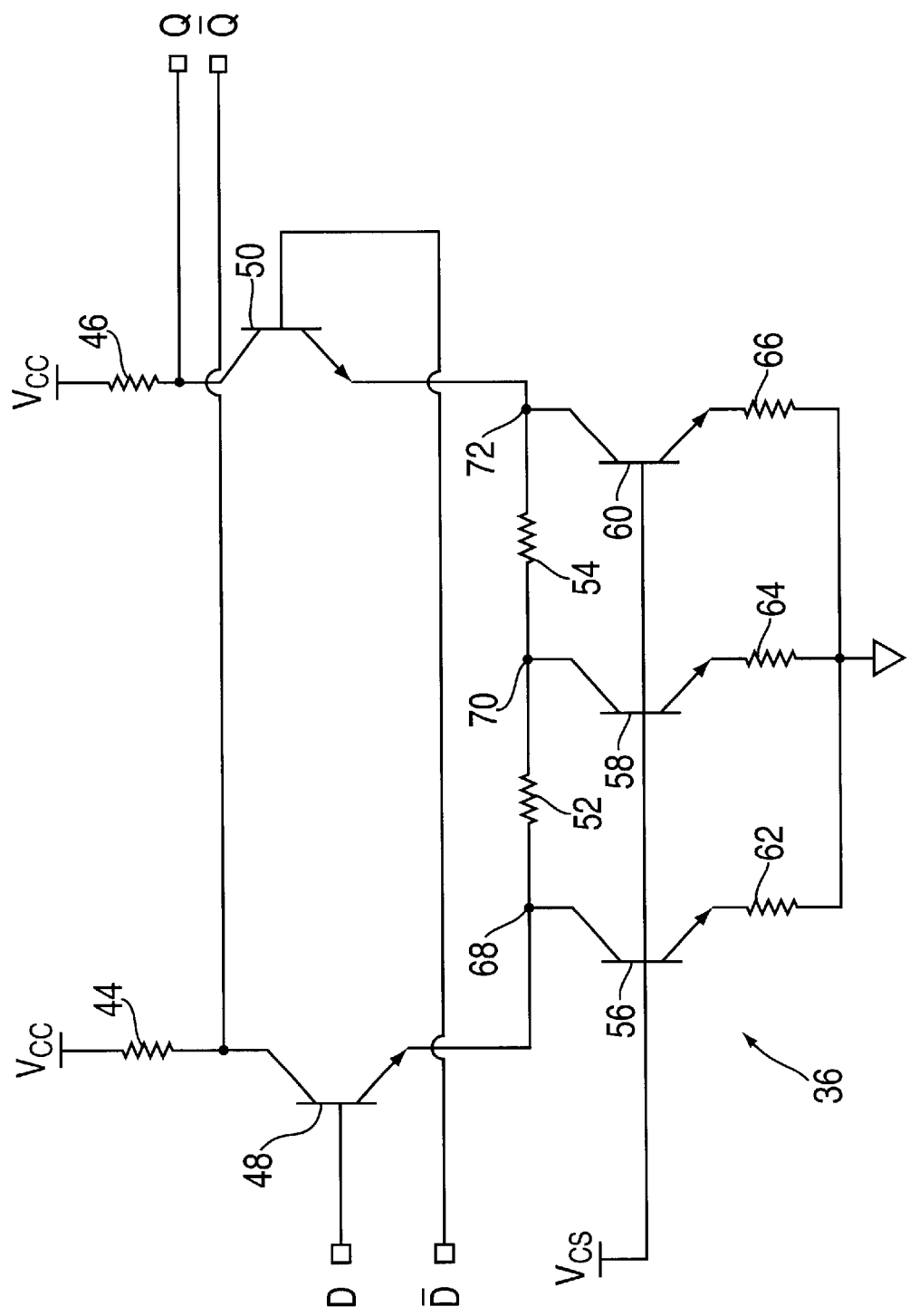
FIG. 3 is a detailed schematic diagram of the ON gate depicted in FIG. 2.

Referring to FIG. 3, a detailed schematic of ON gate 36 is illustrated. Transistors 48 and 50 form the differential input pair, receiving data input signals from terminals D and D-compliment, respectively, at their respective base terminals. The collector terminals of transistors 48 and 50 are coupled to the first terminal of resistors 44 and 46, respectively. Output terminals Q and Q-compliment are coupled to the collector terminals of transistors 50 and 48, respectively. The second terminals of resistors 44 and 46 are coupled to the top rail supply potential $V_{bb}$. The emitter terminal of transistor 48 is coupled to node 68 and to the first terminal of resistor 52. The emitter terminal of transistor 50 is coupled to node 72 and to the first terminal of resistor 54. The second terminal of resistors 52 and 54 are coupled together at node 70. The collector terminals of transistors 56, 58 and 60 are coupled to nodes 68, 70 and 72 respectively. The base terminals of transistors 56, 58 and 60 are coupled to voltage reference $V_{cs}$. The emitter terminals of transistors 56, 58 and 60 are coupled to the first terminal of resistors 62, 64 and 66, respectively. The second terminal of resistors 62, 64 and 66 are coupled together at a bottom rail supply potential, for example, ground potential.

Differential logic inputs are coupled to terminals D and D-compliment. Since the inputs are complimentary, it is understood that a logic state present at terminal D mandates that the reverse logic state is present at terminal D-compliment. A logic high voltage at terminal D, for example, requires a logic low voltage at terminal D-compliment. Likewise, a logic low voltage at terminal D, requires a logic high voltage at terminal D-compliment. A logic high voltage at terminal D induces a maximum current conduction by transistor 48. A logic high voltage at terminal D-compliment creates a maximum current conduction by transistor 50. Similarly, a logic low voltage at terminal D, creates a minimum current conduction by transistor 48. A logic low voltage at terminal D-compliment, creates a minimum current conduction by transistor 50.

Maximum current conduction by transistor 48 is defined to be an amount of current conducted equal to the sum of current conducted by keep alive current source 56 and main current source 58. Maximum current conduction by transistor 50 is defined to be an amount of current conducted equal to the sum of current conducted by keep alive current source 60 and main current source 58. Minimum current conducted by transistor 48 is defined to be an amount of current, which is conducted by keep alive current source 56. Minimum current conducted by transistor 50 is defined to be an amount of current, which is conducted by keep alive current source 60. Resistors 52 and 54 provide the required isolation between main current source 58 and keep alive current source 56 and keep alive current source 60.

Logic levels at terminals Q and Q-compliment are defined by the amount of current conducted by transistors 50 and 48, respectively. A logic high voltage, $V_{OHQ}$, at terminal Q is determined by the voltage dropped across resistor 46, $R_{46}$, during minimum current conduction by transistor 50, $I_{50\text{-}min}$, such that $V_{OHQ}=I_{50\text{-}min}*R_{46}$ and the logic high voltage at terminal Q-compliment, $V_{OHQ\text{-}compliment}$, is similarly given by $V_{OHQ\text{-}compliment}=I_{48\text{-}min}*R_{44}$. The logic low voltage, $V_{OLQ}$, at terminal Q is determined by the voltage dropped across resistor 46, $R_{46}$, during maximum current conduction by transistor 50, $I_{50\text{-}max}$, such that $V_{OLQ}=I_{50\text{-}max}*R_{46}$ and the logic low voltage at terminal Q-compliment is similarly given by $V_{OLQ\text{-}compliment}=I_{48\text{-}max}*R_{44}$.

During operation, ON gate 36 receives complimentary logic inputs at terminals D and D-compliment and transistors 48 and 50 provide current amplification of the input current provided to their respective base terminals. A keep-alive current flows through transistors 48 or 50, when a logic low is provided at the base terminals of transistors 48 or 50, respectively. Keep alive current is provided to transistor 48 by transistor 56, when a logic low is presented at the base terminal of transistor 48 at terminal D. The keep alive current maintains transistor 48 in the active region and provides a logic high potential at terminal Q-compliment. The relationship between the minimum current conducted by transistor 48 and the current conducted by transistor 56 is represented by $I_{48\text{-}min}=I_{56}$. The corresponding logic high input is presented at the base terminal of transistor 50 at terminal D-compliment. A logic high input at terminal D-compliment produces maximum current conduction by transistor 50. Keep alive current is conducted by transistor 60 and the additional current is conducted by transistor 58. The relationship between the maximum current conducted by transistor 50 and the currents conducted by transistors 60 and 58 is represented by $I_{50\text{-}max}=I_{60}+I_{58}$. A static current, or keep alive current, is conducted through both operational states of transistors 48 and 50. A dynamic current is conducted through transistors 48 and 50 only during the maximum current conduction cycle of transistors 48 and 50.

Conversely, keep alive current is provided to transistor 50 by transistor 60, when a logic low is presented at the base terminal of transistor 50 at terminal D-compliment. The keep alive current maintains transistor 50 in the active region and provides a logic high potential at terminal Q. The relationship between the minimum current conducted by transistor 50 and the current conducted by transistor 60 is represented by $I_{50\text{-}min}=I_{60}$. The corresponding logic high input is presented at the base terminal of transistor 48 at terminal D. A logic high input at terminal D produces maximum current conduction by transistor 48. Keep alive current is conducted by transistor 56 and the additional current is conducted by transistor 58. The relationship between the maximum current conducted by transistor 48 and the currents conducted by transistors 56 and 58 is represented by $I_{48\text{-}max}=I_{56}+I_{58}$. Resistors 52 and 54 provide the required isolation between current sources 56, 58 and 60. In addition, resistors 52 and 54 provide additional load impedance to the emitter terminals of transistors 48 and 50, respectively, which in turn provides additional control over input impedance of transistors 48 and 50.

A distinction exhibited by ON gate 36 of FIG. 3 is that transistors 48 and 50 are operating in the active region through the full range of logic potential applied at terminals D and D-compliment, respectively. Transistors 48 and 50, therefore, never enter a non-conductive state at either a logic low or a logic high potential applied at terminals D and D-compliment. Allowing transistors 48 and 50 to remain in the active region establishes a relatively constant gain, $h_{fe}$, of transistors 48 and 50 over the full range of operation. Establishing a relatively constant gain of transistors 48 and 50 creates relatively constant input impedance, $h_{ie}$, of transistors 48 and 50. Providing relatively constant input impedances for transistors 48 and 50 provides a method which enables tighter control over input impedances of ON gate 36, which allows improved signal characteristics such as reduced ringing and smoother logic low to logic high and logic high to logic low transitions. Since ringing is reduced, the effective noise margin of ON gate 36 is widened, thereby reducing the required peak to peak voltage transitions at terminals D, D-compliment, Q and Q-compliment.

By now it should be appreciated that a differential logic gate and a method for operating the differential logic gate have been provided. An advantage exhibited by ON gate 36 is that it provides a method for operating the differential logic gate at reduced logic voltage swings. Reducing logic voltage swings inherently reduces the miller effect, which allows faster operation with reduced ringing.

What is claimed is:

1. A logic gate, comprising:
   an amplifier coupled to receive an input signal and coupled to provide an amplified signal at a first node in response to the input signal;
   a first current source coupled to receive a first portion of the amplified signal at the first node, wherein the first portion is a constant signal maintaining the amplifier in a minimally conductive state; and
   a second current source coupled to receive a second portion of the amplified signal at a second node, wherein the amplified signal consists entirely of the first and second portions.

2. The logic gate of claim 1 wherein the amplifier includes a transistor having a first conduction terminal coupled to a first voltage supply terminal, a second conduction terminal coupled to the first node and a control terminal coupled to receive the input signal.

3. The logic gate of claim 1 wherein the first current source includes a transistor having a first conduction terminal coupled to the first node, a second conduction terminal coupled to a second supply voltage terminal and a control terminal coupled to receive a regulated bias potential.

4. The logic gate of claim 3 wherein the second current source includes a transistor having a first conduction terminal coupled to the second node, a second conduction terminal coupled to the second supply voltage terminal and a control terminal coupled to receive the regulated bias potential.

5. A differential logic gate, comprising:
   a differential amplifier coupled to receive first and second input signals and coupled to provide first and second output signals;
   a first current source coupled to receive a first portion of the first output signal;
   a second current source coupled to receive a first portion of the second output signal; and
   a third current source coupled to receive a second portion of first and second output signals.

6. The differential logic gate of claim 5 wherein the differential amplifier comprises:
   a first transistor having a first conduction terminal coupled to a first supply voltage terminal, a second conduction terminal coupled to a first node, and a control terminal coupled to receive the first input signal; and
   a second transistor having a first conduction terminal coupled to the first supply voltage terminal, a second conduction terminal coupled to a second node, and a control terminal coupled to receive the second input signal.

7. The differential logic gate of claim 6 wherein the first current source includes a transistor having a first conduction terminal coupled to the first node, a second conduction terminal coupled to a second voltage supply terminal and a control terminal coupled to receive a regulated bias potential.

8. The differential logic gate of claim 7 wherein the second current source includes a transistor having a first conduction terminal coupled to the second node, a second conduction terminal coupled to the second voltage supply terminal and a control terminal coupled to receive the regulated bias potential.

9. The differential logic gate of claim 7 wherein the third current source includes a transistor having a first conduction terminal coupled to a third node, a second conduction terminal coupled to the second voltage supply terminal and a control terminal coupled to receive the regulated bias potential.

10. A method of operating a differential logic gate operating between minimum and maximum conduction states in response to first and second input states, comprising:
    generating a first amplifier output signal in response to the first input state to maintain the amplifier in the minimum conduction state; and
    generating a second amplifier output signal in response to the second input state to increase the conduction state of the amplifier to the maximum conduction state, wherein the amplifier consists of a single transistor conducting the entire first and second amplifier output signals.

11. The method of claim 10 wherein generating the first amplifier output signal comprises providing a source of constant current to maintain the minimum conduction state.

12. The method of claim 10 wherein generating the second amplifier output signal comprises providing a source of constant current to sustain the maximum conduction state.

13. A method of operating a differential logic gate, comprising:
    supplying a source of constant current to an input amplifier;
    maintaining a constant operational state of the input amplifier with the source of constant current while receiving first and second input states; and
    controlling a level of gain of the input amplifier to a substantially constant value by maintaining the constant operational state independent of the first and second input states, wherein the input amplifier conducts the entire source of constant current during first and second input states.

14. The method of claim 13 wherein maintaining the constant operational state of the input amplifier includes prohibiting the input amplifier to reach a non-conductive state.

15. An integrated circuit comprising a differential logic gate coupled for receiving an input signal and providing an output signal to a utilization circuit, the differential logic gate comprising:
    a differential amplifier coupled to receive first and second input signals and coupled to provide first and second output signals;
    a first current source coupled to receive a first portion of the first output signal;
    a second current source coupled to receive a first portion of the second output signal; and
    a third current source coupled to receive a second portion of first and second output signals.

16. The differential logic gate of claim 15 wherein the differential amplifier comprises:
    a first transistor having a first conduction terminal coupled to a first supply voltage terminal, a second conduction terminal coupled to a first node, and a control terminal coupled to receive the first input signal; and
    a second transistor having a first conduction terminal coupled to the first supply voltage terminal, a second conduction terminal coupled to a second node, and a control terminal coupled to receive the second input signal.

17. The differential logic gate of claim 16 wherein the first current source includes a transistor having a first conduction terminal coupled to the first node, a second conduction terminal coupled to a second voltage supply terminal and a control terminal coupled to receive a regulated bias potential.

18. The differential logic gate of claim 17 wherein the second current source includes a transistor having a first conduction terminal coupled to the second node, a second conduction terminal coupled to the second voltage supply terminal and a control terminal coupled to receive the regulated bias potential.

19. The differential logic gate of claim 17 wherein the third current source includes a transistor having a first conduction terminal coupled to a third node, a second conduction terminal coupled to the second voltage supply terminal and a control terminal coupled to receive the regulated bias potential.

20. A circuit, comprising:
    an emitter-coupled transistor pair having first and second control terminals coupled to receive first and second input signals;
    a first current source coupled to common emitters of the emitter-coupled transistor pair; and
    second and third standby current sources coupled to the common emitters of the emitter-coupled transistor pair.

* * * * *